(12) United States Patent
Troeger et al.

(10) Patent No.: US 12,105,434 B2
(45) Date of Patent: Oct. 1, 2024

(54) ASSEMBLY, IN PARTICULAR IN A MICROLITHOGRAPHIC PROJECTION EXPOSURE APPARATUS

(71) Applicant: Carl Zeiss SMT GmbH, Oberkochen (DE)

(72) Inventors: Stefan Troeger, Stuetzengruen (DE); Thomas Gorius, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 235 days.

(21) Appl. No.: 17/967,481

(22) Filed: Oct. 17, 2022

(65) Prior Publication Data

US 2023/0034958 A1 Feb. 2, 2023

Related U.S. Application Data

(63) Continuation of application No. PCT/EP2021/059179, filed on Apr. 8, 2021.

(30) Foreign Application Priority Data

Apr. 27, 2020 (DE) .......................... 102020205306.5

(51) Int. Cl.
*G03F 7/20* (2006.01)
*G03F 7/00* (2006.01)
(52) U.S. Cl.
CPC ........ *G03F 7/70825* (2013.01); *G03F 7/7015* (2013.01)

(58) Field of Classification Search
CPC .... G03F 7/70825; G03F 7/7015; G03F 7/708; G03F 7/709; G02B 5/09; G02B 5/0891; G02B 7/182
See application file for complete search history.

(56) References Cited

U.S. PATENT DOCUMENTS

| | | |
|---|---|---|
| 2003/0231412 A1 | 12/2003 | Weber et al. |
| 2011/0292480 A1 | 12/2011 | Ma et al. |
| 2013/0182344 A1 | 7/2013 | Pnini-Mittler |
| 2019/0079417 A1 | 3/2019 | Marsollek |
| 2019/0361362 A1 | 11/2019 | Wesselingh et al. |

FOREIGN PATENT DOCUMENTS

| | | |
|---|---|---|
| DE | 102 26 655 A1 | 1/2004 |
| DE | 10 2011 114 123 A1 | 4/2012 |
| DE | 10 2016 208 008 A1 | 11/2017 |

(Continued)

OTHER PUBLICATIONS

International Preliminary Report on Patentability for PCT Appl No. PCT/EP2021/059179, mailed Nov. 10, 2022.

(Continued)

*Primary Examiner* — Mesfin T Asfaw
(74) *Attorney, Agent, or Firm* — Fish & Richardson P.C.

(57) ABSTRACT

An assembly, for example in a microlithographic projection exposure apparatus, comprises an optical element and a joint arrangement for mechanically bearing the optical element. The joint arrangement comprises at least one connecting element secured on the optical element. The mass of the connecting element is distributed over its length so that the moment of inertia of the connecting element is increased in comparison with a connecting element of identical mass and length in which the mass is distributed uniformly over the length.

20 Claims, 7 Drawing Sheets

(56) References Cited

FOREIGN PATENT DOCUMENTS

| | | |
|---|---|---|
| DE | 10 2018 207 949 A1 | 5/2019 |
| DE | 10 2018 132 436 A1 | 10/2019 |
| JP | S61-24034 A | 2/1986 |
| JP | 2000-090457 | 3/2000 |
| JP | 2012-058662 A | 3/2012 |
| WO | WO 2005/026801 A2 | 3/2005 |
| WO | WO 2008/012336 A1 | 1/2008 |
| WO | WO 2012/084675 A1 | 6/2012 |

OTHER PUBLICATIONS

GPTO-Office Action, with translation thereof, for corresponding DE 10 2020 205 306.5, dated Nov. 12, 2020.
International Search Report and Written Opinion for PCT Appl No. PCT/EP2021/059179, mailed Jul. 15, 2021.
Paul R. Yoder, "Opto-Mechanical Systems Design", Third Edition, SPIE press, pp. 373-375, ISBN 081946091-5.

ASSEMBLY, IN PARTICULAR IN A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2021/059179, filed Apr. 8, 2021, which claims benefit under 35 USC 119 of German Application No. 10 2020 205 306.5 filed on Apr. 27, 2020. The entire disclosure of each of these applications is incorporated by reference herein.

FIELD

The disclosure relates to an assembly, such as a microlithographic projection exposure apparatus.

BACKGROUND

Microlithography is used for production of microstructured components, such as integrated circuits or LCDs, for example. The microlithography process is carried out in an installation known as a projection exposure apparatus, which comprises an illumination device and a projection lens. The image of a mask (=reticle) illuminated via the illumination device is in this case projected via the projection lens onto a substrate (e.g., a silicon wafer) coated with a light-sensitive layer (photoresist) and arranged in the image plane of the projection lens, in order to transfer the mask structure to the light-sensitive coating of the substrate.

In a projection exposure apparatus designed for EUV (e.g., for wavelengths of, e.g., approximately 13 nm or approximately 7 nm), mirrors are used as optical components for the imaging process because of the general unavailability of light-transmissive materials.

These mirrors may be mounted on, e.g., a support frame and be configured as at least partially manipulable, in order to allow a movement of the respective mirror in six degrees of freedom (i.e., with respect to displacements in the three spatial directions x, y and z and also with respect to rotations $R_x$, $R_y$ and $R_z$ about the corresponding axes). This allows compensations to be made for changes in the optical properties that occur for instance during the operation of the projection exposure apparatus, for example as a result of thermal influences. In this case, it is known, e.g., to use in a projection lens of an EUV projection exposure apparatus for the manipulation of optical elements such as mirrors in up to six degrees of freedom three actuator devices, which respectively comprise at least two Lorentz actuators or two actively drivable axes of movement.

Figure 7:
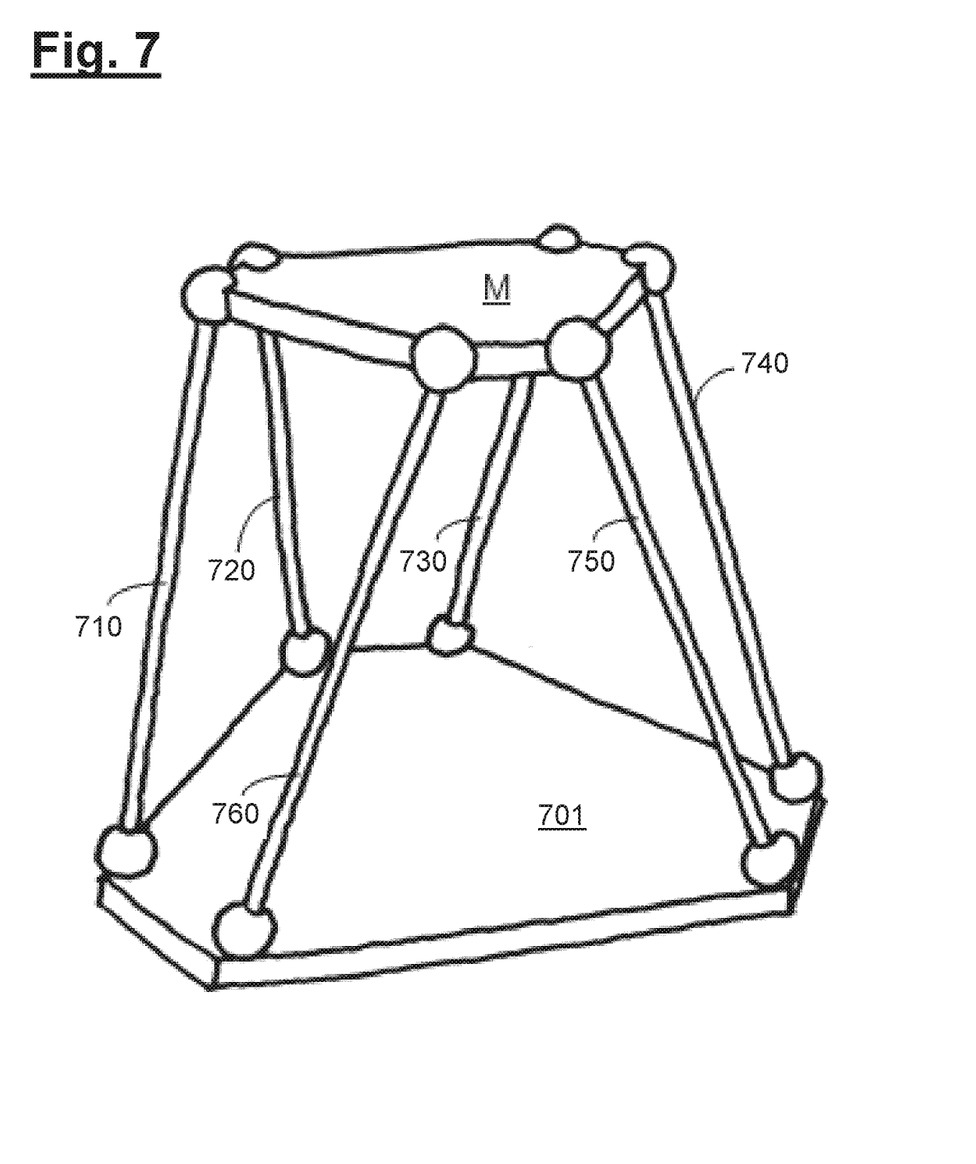
FIG. 7 shows a schematic illustration of a known hexapod structure for elucidating a possible application of the disclosure.

An optical element in the form of a mirror or mirror module (e.g., in the form of a facet mirror) can be mechanically mounted in a known hexapod arrangement as per the illustration of FIG. 7, which is only schematic and in which each of a total of six connecting elements (in the form of pins) 710-760 has ball joints in its end sections, in order to facilitate decoupling from unwanted parasitic forces and torques when actuating the optical element (e.g., a mirror M). An actuator for exerting a controllable force on the optical element or on the mirror M can be provided between the base plate 701 and the respective connecting elements 710-760.

In the case of the small actuator travels typically used in lithography applications (e.g., in the single-digit millimetre range), the use of flexure bearings in the form of Cardan joints (with two tilting joints with orthogonal alignment of the tilt axes with respect to one another) has proven its worth for realizing the function of the aforementioned ball joints. In this case, the Cardan joints can be designed in such a way, for example, that the lowest possible flexural strength is realized in the degrees of freedom not extending along the respective force transmission direction of the actuators.

Figure 8:
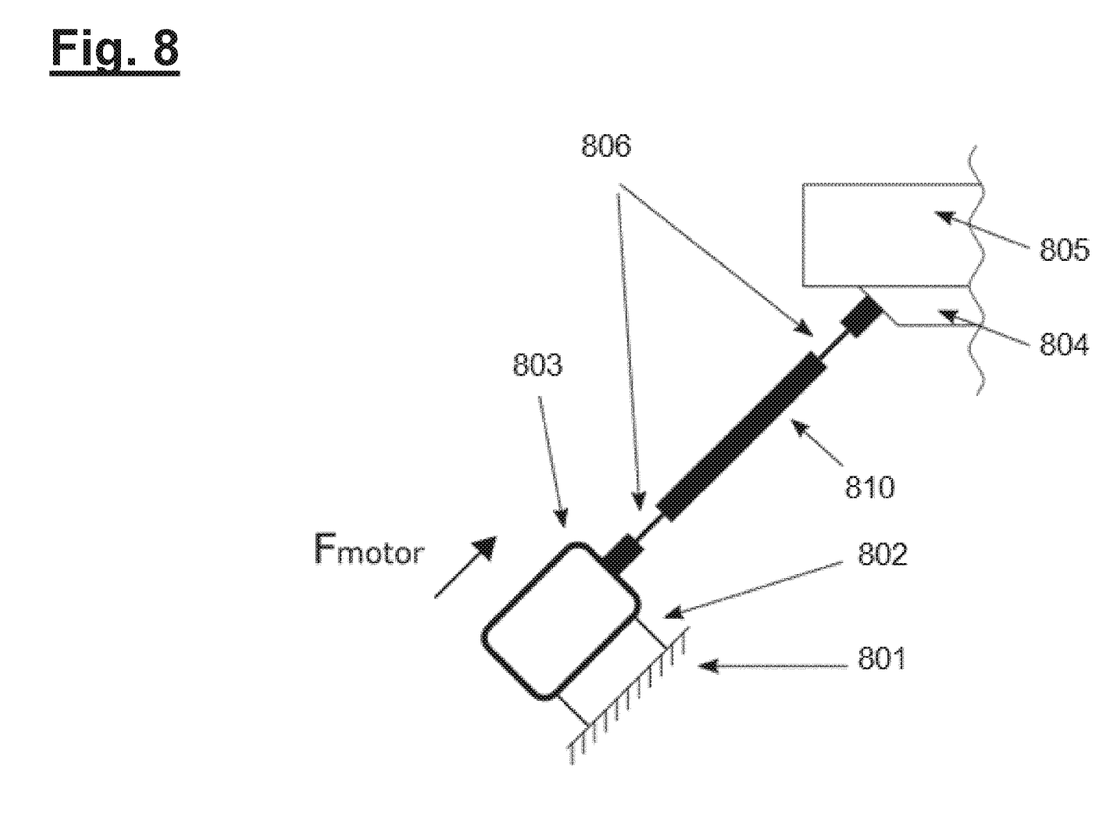
FIGS. 8-9 show schematic illustrations for elucidating an issue occurring in a known assembly.

FIG. 8 shows a schematic illustration for elucidating possible kinematics, wherein a pin-shaped connecting element 810 ("pin") is mounted between, firstly, an optical element 805 in the form of a mirror or a bearing bushing 804 located thereon and, secondly, a movable motor component 803. The aforementioned flexure bearings are denoted by "806". A support frame is denoted by "801", wherein a flexible guide 802 is provided between this support frame 801 and the movable motor component 803.

In practice, in an assembly having the structure described above on the basis of FIG. 8 and depending on the configuration of the connecting element 810, an unwanted parasitic stiffness can occur on account of a frequency-dependent stiffness contribution, even in those degrees of freedom in which the connecting element 810 is designed to be as "soft" as possible (i.e., with the lowest possible flexural strength). This frequency-dependent parasitic stiffness contribution can result in a deflection in the region of one end section of the connecting element 810, or an unwanted force at the respective other end section of the connecting element 810. As a consequence, it is possible that the sought-after decoupling by way of the aforementioned flexure bearings 806 is no longer provided to the desired extent, and so vibrations, for example, on the side of the support structure 801, can be transferred to the optical element 805 or the mirror.

Figure 9:
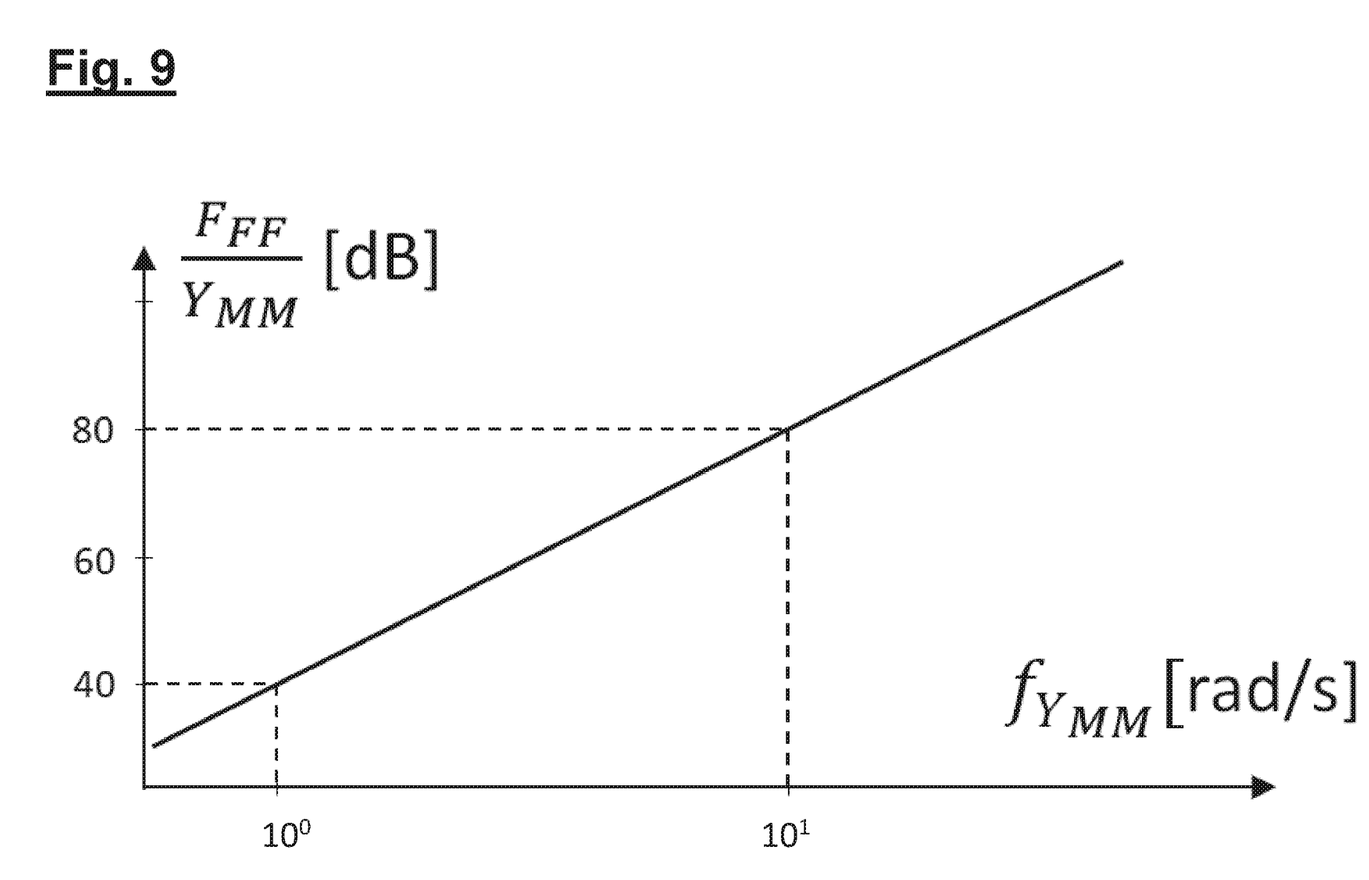

The above-described effect also becomes clear from the diagram in FIG. 9. Therein, $Y_{MM}$ denotes the deflection occurring at one end section of the connecting element 110 and $F_{FF}$ denotes the (bearing) force acting at the opposite end section of the connecting element 110 on account of a frequency-dependent parasitic stiffness of the connecting element 110. According to FIG. 9, already comparatively small deflections at elevated frequencies $f_{Y_{MM}}$ at one end of the connecting element 810 (for example on the side of the support structure 801) lead to significant forces at the other end of the connecting element 810 (for example at the optical element 805 or mirror).

With respect to known technology, reference is made merely by way of example to WO 2005/026801 A2, WO 2008/012336 A1 and WO 2012/084675 A1.

SUMMARY

The present disclosure seeks to provide an assembly, for example in a microlithographic projection exposure apparatus, which assembly facilitates the minimization of the introduction of parasitic vibration excitations during the actuation and/or bearing of an optical element.

According to one aspect, the disclosure relates to an assembly, for example in a microlithographic projection exposure apparatus, comprising
  an optical element; and
  a joint arrangement for mechanically bearing the optical element, wherein the joint arrangement comprises at least one connecting element secured on the optical element;
  wherein the mass $m_{pin}$ of the connecting element is distributed over its length L in such a way that the moment of inertia I of the connecting element is increased in comparison with a connecting element of identical mass and length, in which the mass is distributed uniformly over the length.

Here, and below, the moment of inertia of the connecting element should be understood to mean the moment of inertia that—in the case of a rotation of the connecting element as a result of deflection—occurs at the centre of mass of the connecting element.

For example, for an assembly comprising a joint arrangement having at least one connecting element for the purposes of mechanically bearing an optical element, the disclosure is based on the concept of configuring the relevant connecting element in a targeted fashion, in such a way that the above-described frequency-dependent effect or a parasitic stiffness caused by this effect is reduced or minimized to the best possible extent.

Here, the disclosure considers that, for example, the stated frequency-dependent stiffness contribution—as explained in more detail below on the basis of the relevant mathematical relationship—is composed of two terms with different signs, with one of these terms being proportional to the moment of inertia of the connecting element and the other term being proportional to the mass of the connecting element. Proceeding from this consideration, the disclosure considers that the term relevant to the parasitic stiffness can be made to be as small as possible (ideally virtually zero) as a result of a correspondingly suitable choice or adjustment of the two parameters of, firstly, "moment of inertia" of the connecting element and, secondly, "mass" of the connecting element.

For example, as will also be discussed further below, in order to minimize the frequency-dependent parasitic stiffness contribution, it is desirable for the deviation of the value of the moment of inertia I from the value of the term $(L-L_s)L_s m_{pin}$ to have a value that is as small as possible (ideally equal to zero).

The above (non-uniform) distribution of the mass $m_{pin}$ of the connecting element over its length L is advantageous for example in so far as the afore-mentioned condition (i.e. small value of the deviation of the value of the moment of inertia I from the value of the term $(L-L_s)L_s m_{pin}$) can be achieved in a constructional relatively simple manner. For example, in certain embodiments only the inertia I is modified while the centre of mass $L_s$ as well as the mass $m_{pin}$ may remain unchanged. Further, in certain embodiments a symmetrical modification of the mass distribution of the connecting element over its length can be realized.

For example, the disclosure is advantageously realizable in the case of the mechanical bearing of all mirrors or mirror modules (e.g., facet mirrors), within the scope of which the avoidance of occurring vibrations should be ensured during the operation of the relevant optical system.

According to one embodiment, the connecting element has a first section facing the optical element, a second section distant from the optical element and a third section located between the first section and the second section, wherein the connecting element is tapered in the third section in comparison with the first and/or second section.

According to one embodiment, the connecting element is mounted by way of a bearing at its end section distant from the optical element, wherein the connecting element extends beyond this bearing in the direction facing away from the optical element.

According to one embodiment, the connecting element has a substantially pin-shaped geometry.

According to one embodiment, the connecting element has a hollow embodiment, at least in regions. In this way, the mass $m_{pin}$ of the connecting element can be reduced in comparison with a connecting element without a hollow configuration, while leaving the flexural and axial stiffness the same (and hence maintaining the functionality of the connecting element).

According to one embodiment, the optical element is a mirror or a mirror module. For example, this mirror module can also be configured as a facet mirror with a plurality of mirror facets.

According to one embodiment, the optical element is designed for an operating wavelength of less than 30 nm, for example of less than 15 nm.

According to one embodiment, the connecting element is designed with respect to its mass ($m_{pin}$), its moment of inertia (I), its length (L) and its centre of mass ($L_s$) in such a way that the moment of inertia (I) of the connecting element has a value ranging between 50% and 150% of the value of the term $(L-L_s)L_s m_{pin}$.

The disclosure also relates to an assembly, for example in a microlithographic projection exposure apparatus, comprising:
 an optical element; and
 a joint arrangement for mechanically bearing the optical element, wherein the joint arrangement comprises at least one connecting element secured on the optical element;
 wherein this connecting element is designed with respect to its mass ($m_{pin}$), its moment of inertia (I), its length (L) and its centre of mass ($L_s$) in such a way that the moment of inertia (I) of the connecting element has a value ranging between 50% and 150% of the value of the term $(L-L_s)L_s m_{pin}$.

According to one embodiment, the moment of inertia I of the connecting element has a value ranging between 70% and 130%, for example ranging between 90% and 110%, of the value of the term $(L-L_s)L_s m_{pin}$.

According to one embodiment, the mass $m_{pin}$ of the connecting element is distributed irregularly over its length L.

According to one embodiment, the mass $m_{pin}$ of the connecting element is distributed over its length L in such a way that the moment of inertia I of the connecting element is increased in comparison with a connecting element of identical mass and length, in which the mass is distributed uniformly over the length.

The disclosure also relates to an optical system of a microlithographic projection exposure apparatus that has at least one assembly with the features described above.

Further configurations of the disclosure can be gathered from the description and the dependent claims.

The disclosure is explained in greater detail below on the basis of exemplary embodiments illustrated in the accompanying figures.

DESCRIPTION OF EXEMPLARY EMBODIMENTS

Figure 6:
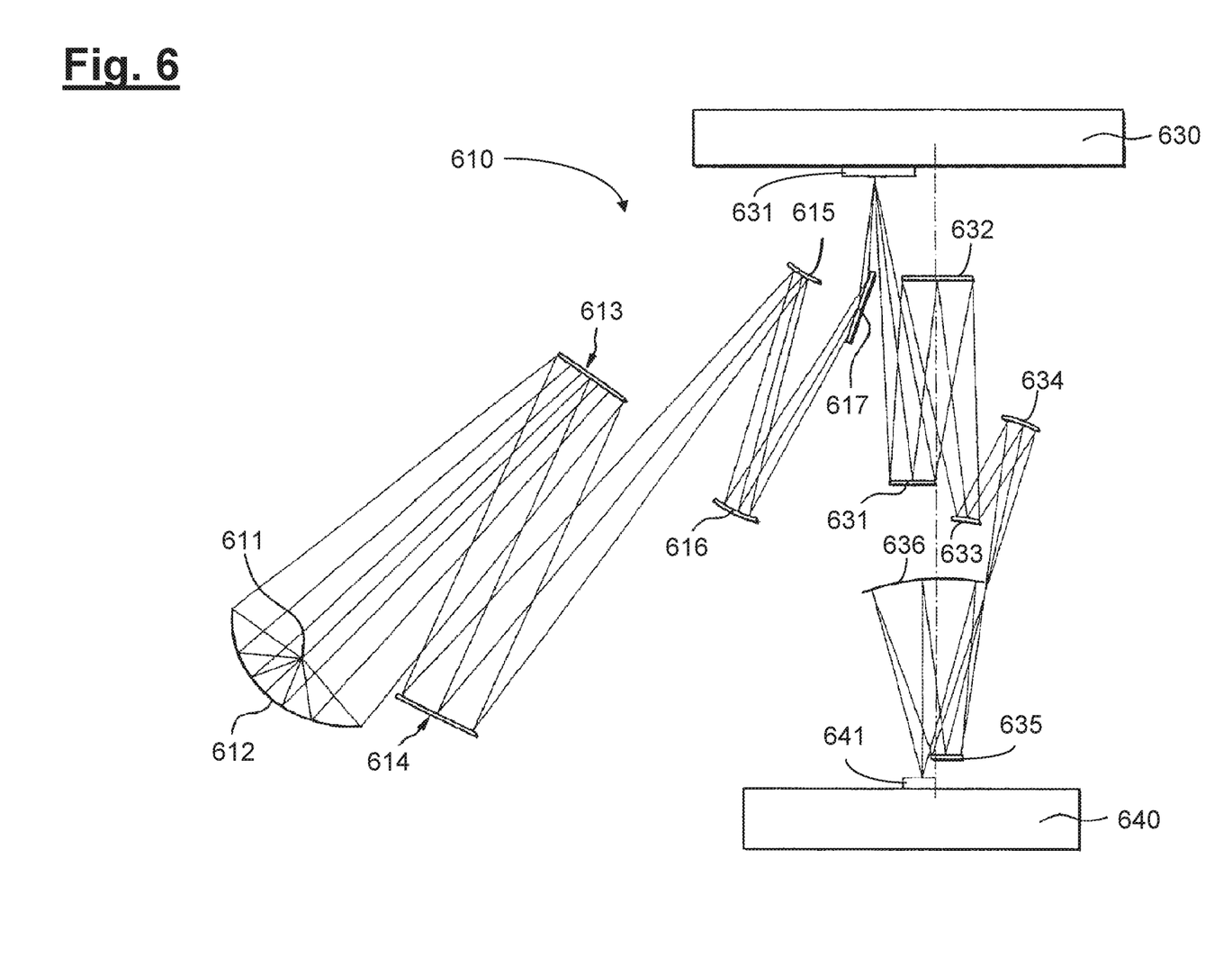
FIG. 6 shows a schematic illustration for elucidating the possible set-up of a microlithographic projection exposure apparatus designed for operation in the EUV.

FIG. 6 firstly shows a merely schematic illustration of a projection exposure apparatus 610 which is designed for operation in the EUV and in which the present disclosure can be realized in an exemplary manner.

According to FIG. 6, an illumination device of the projection exposure apparatus 610 comprises a field facet mirror 613 and a pupil facet mirror 614. The light from a light source unit comprising a plasma light source 611 and a collector mirror 612 is directed at the field facet mirror 613. A first telescope mirror 615 and a second telescope mirror 616 are arranged in the light path downstream of the pupil facet mirror 614. A deflection mirror 617 operated with grazing incidence is arranged downstream in the light path and directs the radiation incident thereon at an object field in the object plane of a projection lens with mirrors 631-636, which is merely indicated in FIG. 6. At the location of the object field, a reflective structure-bearing mask 631 is arranged on a mask stage 630, the mask being imaged with the aid of a projection lens into an image plane in which a substrate 641 coated with a light-sensitive layer (photoresist) is situated on a wafer stage 640.

The assembly according to the disclosure serves for mechanical bearing and/or actuation of an optical element, which might be, purely by way of example, a mirror or a mirror module of a microlithographic projection exposure apparatus (e.g., the projection exposure apparatus 610 in FIG. 6).

Figure 1:
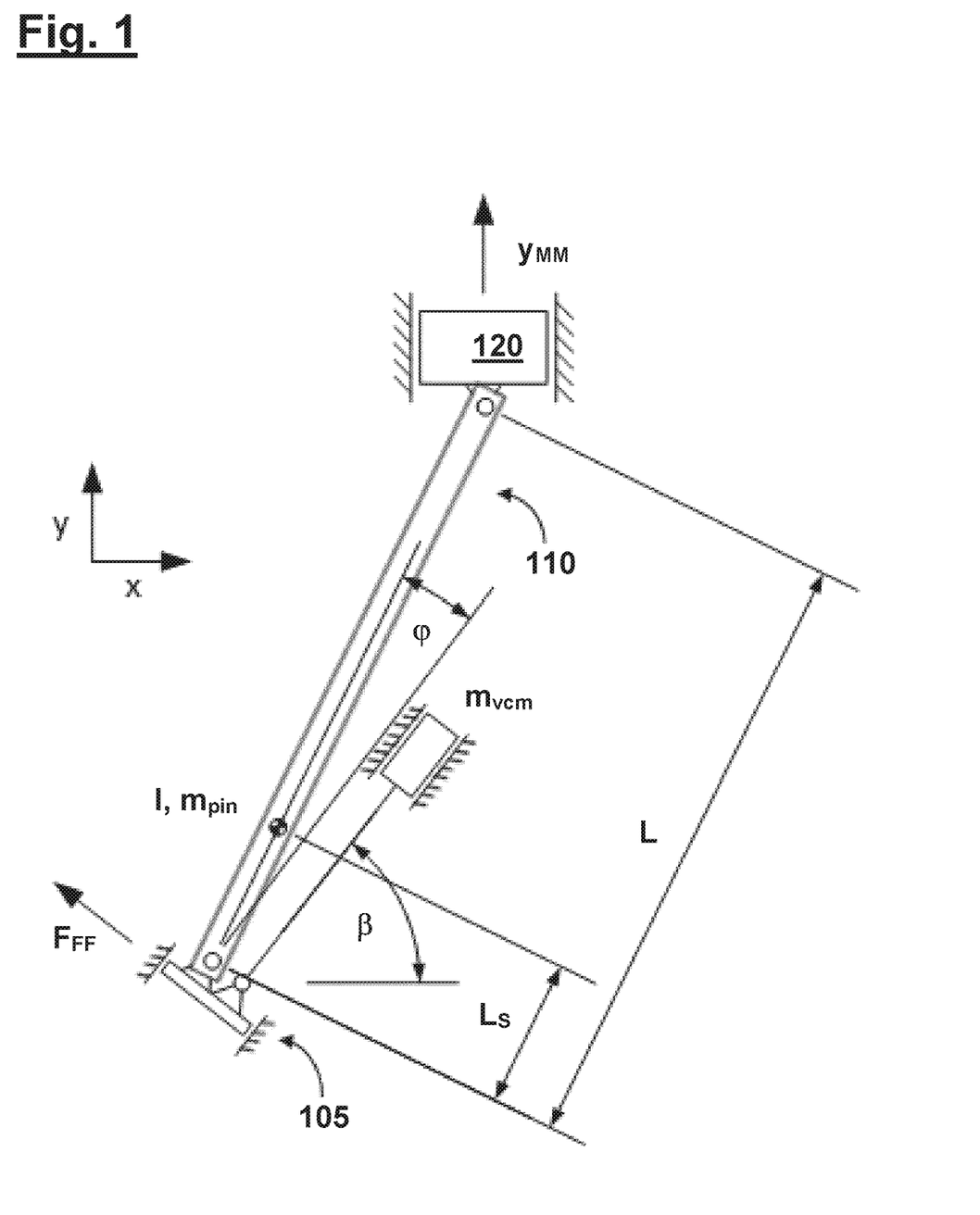
FIG. 1 shows a schematic illustration for elucidating a concept of the disclosure.

FIG. 1 shows a merely schematic and much simplified illustration for elucidating a concept of the present disclosure.

According to FIG. 1, "110" indicates a connecting element in the form of a pin, as is able to be used, for example, in a hexapod arrangement as per FIG. 7. In further embodiments, the arrangement can also be a bearing (also referred to as "3-2-1 bearing"), in which three connecting elements extending parallel to a first spatial direction (e.g., x-direction) bring about securing in three degrees of freedom (e.g., x, $R_y$, $R_z$), two further connecting elements extend parallel to a spatial direction perpendicular thereto (e.g., y-direction) and bring about securing in two further degrees of freedom (e.g., y and $R_x$), and a further connecting element in the remaining, in turn perpendicular spatial direction (z-direction) brings about securing in one degree of freedom (z). In this context, reference is made to the publication Paul R. Yoda: "Opto-Mechanical Systems Design", Third Edition, ISBN 081946091-5, with respect to known technology.

"105" indicates, purely schematically, a section of the supporting structure (e.g., a support frame of an illumination device), whereas "120" denotes an optical element or mirror module.

Using a model-like description of the structure as per FIG. 1 on the basis of a mechanical model and an existing force equilibrium, the following relationship (1) can be derived between a deflection $y_{MM}$ resulting at one end section of the connecting element 110 and a (bearing) force $F_{FF}$ acting at the opposite end section of the connecting element 110 on account of a frequency-dependent parasitic stiffness of the connecting element 110:

$$|F_{FF}| = \left| \frac{I - (L - L_s)L_s m_{pin}}{L^2} \cos\beta \ddot{y}_{MM} \right| \quad (1)$$

Equation (1) has been linearized. In this case, I denotes the moment of inertia of the connecting element 110, denotes the mass of the connecting element 110, L denotes the length of the connecting element 110, $L_s$ denotes the path between the end section of the connecting element 110 distant from the optical element 120 and the centre of mass of the connecting element 110, and β denotes the deflection of the connecting element 110 or of the pin in the fundamental state (i.e., without movement). Depending on the combination of the degrees of freedom of deflection $y_{MM}$ and force $F_{FF}$ (e.g., deflection in the x-direction in the case of a force in the z-direction or deflection in the z-direction in the case of a force in the y-direction), the relationship between deflection $y_{MM}$ and force $F_{FF}$ may possibly deviate slightly from the aforementioned specific relationship. In FIG. 1, $m_{vcm}$ denotes the moving part of the motor. φ denotes the deflection relative to the "zero-position" of the optical element 120 (i.e. φ will be zero for $y_{MM}$=0). Accordingly, β+φ will be the deflection of the connecting element 110 resulting from a general movement or deflection $y_{MM}$ in any arbitrary position.

Even if the deflection $y_{MM}$ in FIG. 1 is considered at the end section of the connecting element 110 facing the optical element 120 and the force $F_{FF}$ is considered at the opposite end section of the connecting element 110 thereto (i.e., at the end section facing the support frame 105), reference is made to the fact that the relationship (1) also exists in the "reverse direction", i.e., for the relationship between a deflection present on the side of the support frame 105 and a force resulting at the optical element 120 as a consequence of a frequency-dependent parasitic stiffness of the connecting element 110.

In order now to minimize the force resulting on the side of the optical element 120 from a frequency-dependent parasitic stiffness contribution of the connecting element 110 in the case of a deflection occurring on the part of the support frame 105 (e.g., due to vibration), it is desirable according to Equation (1) for the term $$\frac{I - (L - L_s)L_s m_{pin}}{L^2}$$

and hence also for the deviation of the value of the moment of inertia I from the value of the term $(L-L_s)L_s m_{pin}$ to have a value that is as small as possible (ideally equal to zero).

Proceeding from this idea, the disclosure now contains the principle of achieving the minimization of the aforementioned term by way of a suitable design of the connecting element 110 in view of the parameters occurring in this term. According to the disclosure, the moment of inertia I of the connecting element 110 has a value ranging between 50% and 150%, for example ranging between 70% and 130%, such as ranging between 90% and 110%, of the value of the term $(L-L_s)L_s m_{pin}$.

In the process, according to the disclosure, it is possible for example to exploit the circumstances that in the aforementioned mathematical expression that is decisive for the frequency-dependent stiffness contribution the term or summand proportional to the moment of inertia of the connecting element has an opposite sign to the term or summand proportional to the mass $m_{pin}$ of the connecting element.

Since the quantity $L-L_s$ always has a positive value, suitably adjusting the moment of inertia I for a given mass $m_{pin}$ of the connecting element 110 specifically makes it possible to achieve that the summands I and $(L-L_s)L_s m_{pin}$ are (at least approximately) the same size in terms of absolute magnitude and hence the term relevant to the frequency-dependent stiffness contribution becomes (at least approximately) zero.

According to the disclosure, the aforementioned suitable adjustment of the parameters (for example of the moment of inertia I) of the connecting element 110 can be achieved by various measures, as will be elucidated below with reference to the purely schematic and much simplified illustrations of FIG. 2-5. In this case, attention is drawn to the fact that the relevant measures can also be realized in combination depending on the specific application situation. F denotes a bearing force (or constraint force), while x denotes the deflection occurring at the opposite end section of the connecting element.

Figure 2:
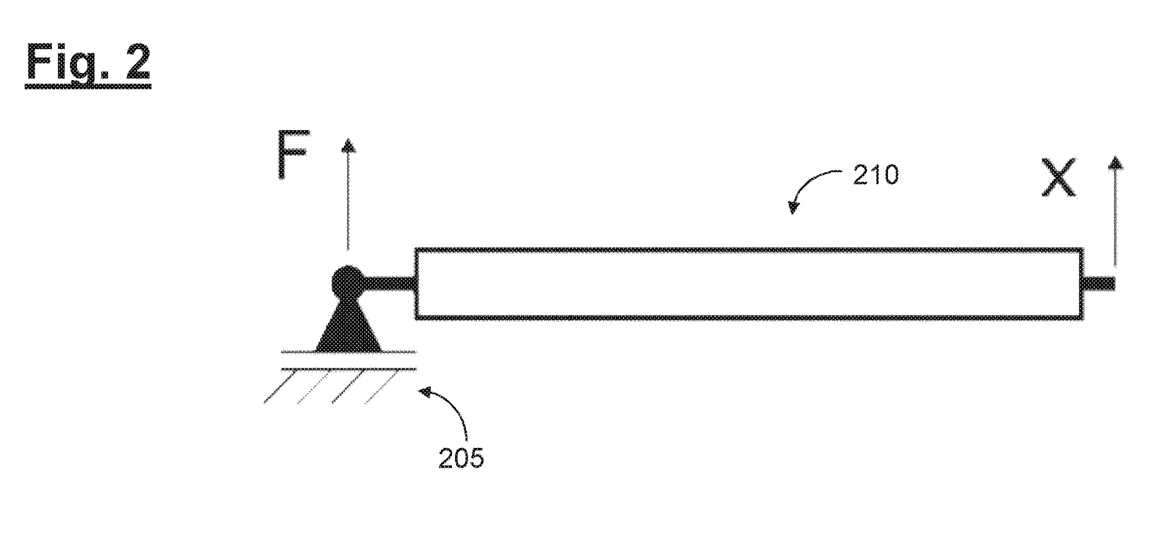
FIGS. 2-5 show schematic illustrations for elucidating possible embodiments of a connecting element used in an assembly according to the disclosure.

According to FIG. 2, a connecting element 210 according to the disclosure (which is mounted on a support structure 205 at its one end section in the schematic illustration) can have a hollow embodiment, for example at least in regions. This reduces, for example, the mass $m_{pin}$ of the connecting element 210 in comparison with a connecting element 210 that does not have a hollow configuration, with the flexural and axial stiffness remaining unchanged (and hence with the functionality of the connecting element 210 being maintained). A reduction in the mass $m_{pin}$ (without violating existing desired properties for stiffness) can additionally also be obtained by using a suitable material during the production of the connecting element 210, for example by using a ceramic material instead of a metallic material.

Figure 3:
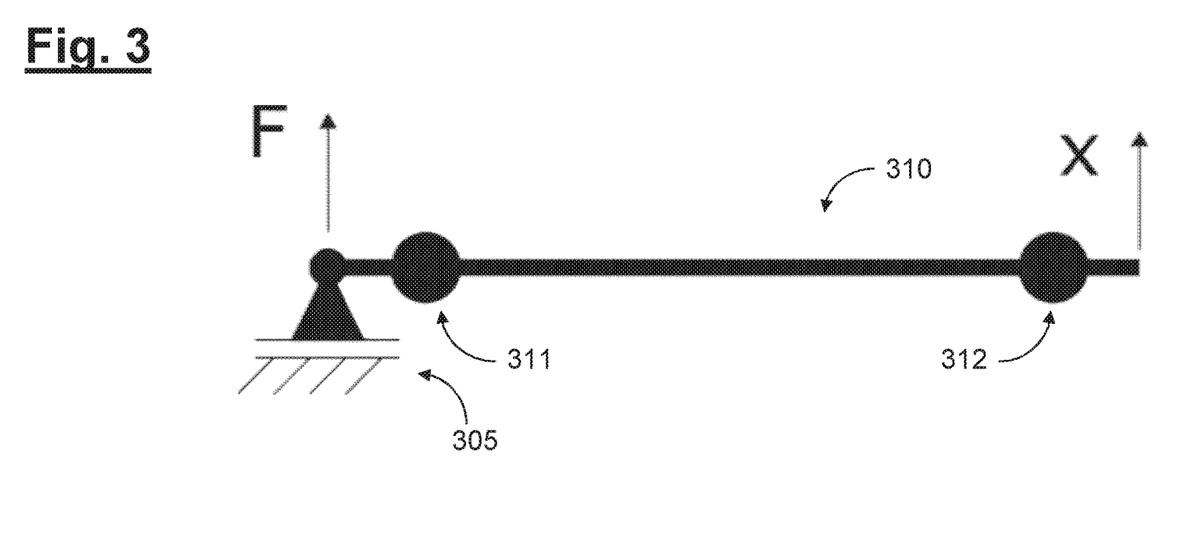
Figure 4:
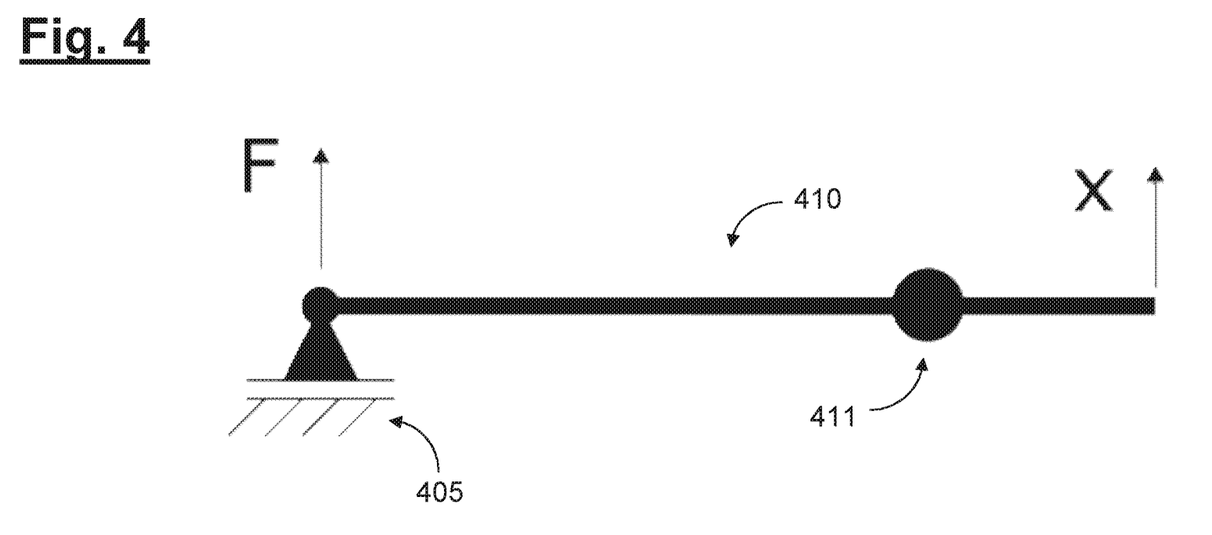

According to FIG. 3 and FIG. 4, the connecting element 310 and 410, respectively, can also have a mass $m_{pin}$ that is distributed irregularly over the respective length L in further embodiments. For example, the connecting element 310 or 410 can have a lower mass in a region situated between its outer end sections, which can be obtained, in turn, by reducing the diameter in this region and/or attaching additional mass(es) to the respective outer regions or end sections (as indicated in FIG. 3 and FIG. 4 by the reference signs "311" and "312", and "411", respectively). "305" or "405" denote the support structure in FIG. 3 and FIG. 4, respectively.

Figure 5:
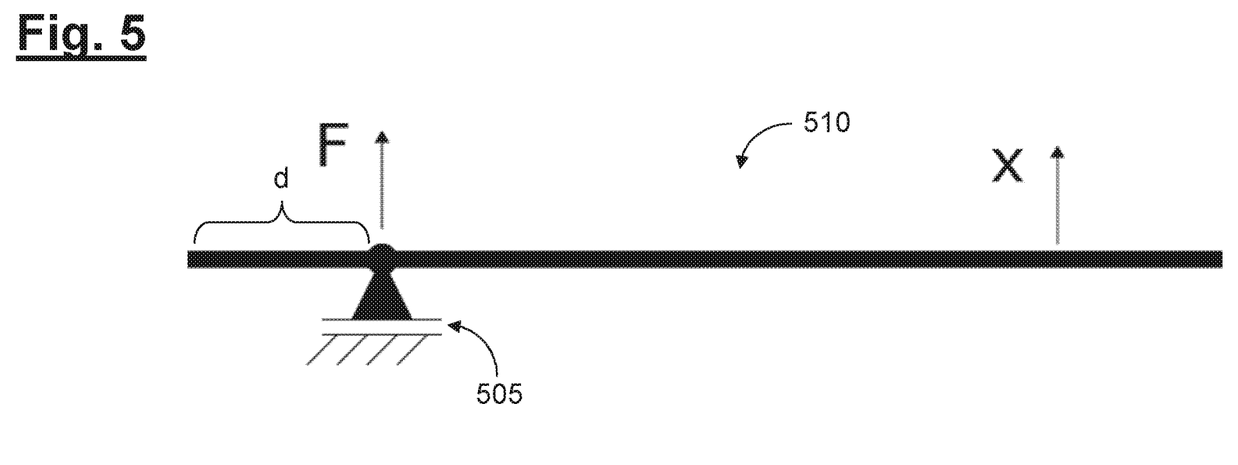

Moreover, as per FIG. 5, a connecting element 510 can also be configured in such a way that it extends beyond a bearing 505 at its end section distant from the optical element, with the length of the corresponding projecting section being denoted by "d" in FIG. 5. Since the projecting section contributes to the relevant moment of inertia I in Equation (1) but not to the relevant mass $m_{pin}$, this allows an increase in the moment of inertia I to be obtained in comparison with a configuration of the connecting element with the same mass $m_{pin}$ but without a projecting section.

Even though the disclosure has been described on the basis of specific embodiments, numerous variations and alternative embodiments will be apparent to a person skilled in the art, for example through combination and/or exchange of features of individual embodiments. Accordingly, it goes without saying for a person skilled in the art that such variations and alternative embodiments are encompassed by the present disclosure, and the scope of the disclosure is only restricted as provided by the appended patent claims and the equivalents thereof.

What is claimed is:

1. An assembly, comprising:
   an optical element; and
   a joint arrangement configured to mechanically bear the optical element,
   wherein:
   the joint arrangement comprises a connecting element secured on the optical element;
   the connecting element has a mass (m), a moment of inertia (I), a length (L), and a center of mass ($L_s$); and
   (I) is between 50% and 150% of $(L-L_s)L_s m$.

2. The assembly of claim 1, wherein:
   the connecting element is mounted via a bearing at an end section of the connecting element that is distant from the optical element; and
   the connecting element extends beyond the bearing in a direction facing away from the optical element.

3. The assembly of claim 1, wherein (I) is between 70% and 130% of $(L-L_s)L_s m$.

4. The assembly of claim 1, wherein (I) is between 90% and 110% of $(L-L_s)L_s m$.

5. The assembly of claim 1, wherein the connecting element has a hollow portion.

6. The assembly of claim 1, wherein the connection element has hollow regions.

7. The assembly of claim 1, wherein the mass (m) of the connecting element is distributed irregularly over its length (L).

8. The assembly of claim 7, wherein the mass (m) of the connecting element is distributed over its length (L) so that the moment of inertia (I) of the connecting element is increased compared with a connecting element having an identical mass, an identical length and a mass that is uniformly distributed over its length.

9. The assembly of claim 1, wherein:
   the connecting element has a first section facing the optical element, a second section distant from the optical element, and a third section located between the first section and the second section; and
   the connecting element the third section is tapered compared with at least one section selected from the group consisting of the first section and the second section.

10. The assembly of claim 1, wherein the connecting element has a substantially pin-shaped geometry.

11. The assembly of claim 1, wherein the optical element comprises a mirror module.

12. The assembly of claim 1, wherein the optical element comprises a mirror.

13. The assembly of claim 1, wherein the optical element is configured for an operating wavelength of less than 30 nm.

14. An optical system, comprising:
   an assembly according to claim 1.

15. An apparatus, comprising:
   an assembly according to claim 1,
   wherein the apparatus is a microlithographic projection exposure apparatus.

16. The apparatus of claim 15, wherein the assembly comprises a mirror.

17. The apparatus of claim 15, wherein the assembly comprises a mirror module.

18. The apparatus of claim 15, wherein the assembly comprises a facet mirror.

19. The apparatus of claim 15, wherein the microlithographic projection exposure apparatus is an EUV microlithographic projection exposure apparatus.

20. An assembly, comprising:
   an optical element; and
   a joint arrangement configured to mechanically bear the optical element, wherein:
the joint arrangement comprises a connecting element secured on the optical element; and
a mass of the connecting element is distributed over a length of the connecting element so that a moment of inertia of the connecting element is increased compared with a connecting element having an identical mass, an identical length and a mass that is uniformly distributed over its length.

* * * * *

UNITED STATES PATENT AND TRADEMARK OFFICE
CERTIFICATE OF CORRECTION

| | |
|---|---|
| PATENT NO. | : 12,105,434 B2 |
| APPLICATION NO. | : 17/967481 |
| DATED | : October 1, 2024 |
| INVENTOR(S) | : Stefan Troeger and Thomas Gorius |

Page 1 of 1

It is certified that error appears in the above-identified patent and that said Letters Patent is hereby corrected as shown below:

In the Specification

Column 6, Line 6, after "110," insert -- $m_{pin}$ --.

Column 7, Line 13, delete "FIG. 2-5." insert -- FIGS. 2-5. --.

In the Claims

Column 8, Claim 1, Line 7, delete "(1)" insert -- (I) --.

Signed and Sealed this
Third Day of December, 2024

Katherine Kelly Vidal
*Director of the United States Patent and Trademark Office*